(12) United States Patent
Sonobe et al.

(10) Patent No.: US 12,125,511 B2
(45) Date of Patent: Oct. 22, 2024

(54) MAGNETIC MEMORY DEVICE AND MAGNETIC MEMORY APPARATUS WITH PERPENDICULAR MAGNETIC ANISOTROPY

(71) Applicant: Samsung Electronics Co., Ltd., Suwon-si (KR)

(72) Inventors: Yoshiaki Sonobe, Fujisawa (JP); Syuta Honda, Shimamoto town (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 378 days.

(21) Appl. No.: 17/495,450

(22) Filed: Oct. 6, 2021

(65) Prior Publication Data

US 2022/0115049 A1 Apr. 14, 2022

(30) Foreign Application Priority Data

Oct. 13, 2020 (JP) .................................. 2020-172269
Jun. 28, 2021 (KR) .......................... 10-2021-0084161

(51) Int. Cl.
*G11C 11/16* (2006.01)

(52) U.S. Cl.
CPC ........ *G11C 11/161* (2013.01); *G11C 11/1673* (2013.01); *G11C 11/1675* (2013.01)

(58) Field of Classification Search
CPC .... G11C 7/00; G11C 7/10; G11C 7/08; G11C 11/00; G11C 11/02; G11C 11/16;
(Continued)

(56) References Cited

U.S. PATENT DOCUMENTS 7,924,593 B2 4/2011 Lee et al.
9,184,375 B1 11/2015 Tang et al.
(Continued)

FOREIGN PATENT DOCUMENTS

JP 2010-010683 A 1/2010
JP 2013-201220 A 10/2013
(Continued)

OTHER PUBLICATIONS

Stuart Parkin et al., Magnetic Domain-Wall Racetrack Memory, Science vol. 320, Issue 5873, pp. 190-194 (Apr. 11, 2008).*
(Continued)

*Primary Examiner* — Joshua L Schwartz
(74) *Attorney, Agent, or Firm* — Harness, Dickey & Pierce, P.L.C.

(57) ABSTRACT

A magnetic memory device includes a first fixed layer maintaining a particular magnetization direction, a first non-magnetic layer, a free layer having perpendicular magnetic anisotropy and a variable magnetization direction, a second non-magnetic layer, and a second fixed layer maintaining a separate particular magnetization direction that is opposite to the particular magnetization direction of the first fixed layer. A resistance value of a first magnetic tunnel junction (MTJ) element including the first fixed layer, the first non-magnetic layer, and the free layer is different from that of a second MTJ element that includes the second fixed layer, the second non-magnetic layer, and the free layer, based on a first portion of the free layer in the first MTJ and a second portion of the free layer in the second MTJ being separated by a domain wall.

18 Claims, 12 Drawing Sheets

(58) Field of Classification Search
CPC .............. G11C 11/161; G11C 11/1673; G11C 19/0825; G11C 19/0833; G11C 11/1675; G11C 11/1697; G11C 14/00; G11C 14/009; G11C 14/036; G11C 13/00; G11C 13/0021; G11C 13/0002; G11C 13/0069
See application file for complete search history.

(56) References Cited

U.S. PATENT DOCUMENTS

| | | |
|---|---|---|
| 9,184,376 B2 | 11/2015 | Park et al. |
| 9,343,129 B2 | 5/2016 | Shimomura |
| 9,830,968 B2 | 11/2017 | Shimomura et al. |
| 9,831,423 B2 | 11/2017 | Kondo et al. |
| 9,941,468 B2 | 4/2018 | Fukami et al. |
| 10,068,946 B2 | 9/2018 | Shimomura et al. |
| 2009/0079018 A1* | 3/2009 | Nagase .................. H10N 50/85 257/E29.323 |
| 2009/0147562 A1* | 6/2009 | Clinton ............... G11C 11/1673 365/158 |
| 2014/0015073 A1* | 1/2014 | Lee ........................ H01L 29/82 257/421 |
| 2017/0076770 A1 | 3/2017 | Daibou et al. |

FOREIGN PATENT DOCUMENTS

| | | |
|---|---|---|
| JP | 2015-115610 A | 6/2015 |
| JP | 2017-059593 A | 3/2017 |
| JP | 2017-059595 A | 3/2017 |
| JP | 2017-059634 A | 3/2017 |
| JP | 2017-059679 A | 3/2017 |
| JP | 2017-112351 A | 6/2017 |
| JP | 6178451 B1 | 8/2017 |
| JP | 2020-043364 A | 3/2020 |
| JP | 2020-107790 A | 7/2020 |
| WO | WO-2016/021468 A1 | 2/2016 |

OTHER PUBLICATIONS

K. Watanabe et al. "Shape anisotropy revisited in single-digit nanometer magnetic tunnel junctions", Article, Nature Communications; published 2018; pp. 1-6.

* cited by examiner

MAGNETIC MEMORY DEVICE AND MAGNETIC MEMORY APPARATUS WITH PERPENDICULAR MAGNETIC ANISOTROPY

CROSS-REFERENCE TO RELATED APPLICATIONS

This application claims the benefit of Japanese Patent Application No. 2020-172269, filed on Oct. 13, 2020, in the Japanese Patent Office and Korean Patent Application No. 10-2021-0084161, filed on Jun. 28, 2021, in the Korean Intellectual Property Office, the disclosures of each of which are incorporated herein in their entireties by reference.

BACKGROUND

The inventive concepts relate to magnetic memory devices and magnetic memory apparatuses, and more particularly, to 2-terminal structural magnetic memory devices and magnetic memory apparatuses.

A magnetoresistive element performing reading with vertical magnetization by the magnetoresistance effect has high thermal agitation tolerance against miniaturization and is expected to be next generation memory. The magnetoresistive element includes a free layer having a variable magnetization direction, a fixed layer maintaining a particular (or, alternatively, predetermined) magnetization direction, and a magnetic tunnel junction (MTJ) layer having an insulator layer arranged between the free layer and the fixed layer. Commercialization of spin transfer torque magnetoresistive random access memory (STT-MRAM) based on an MTJ element is being performed. The STT-MRAM has a 2-terminal structure in which a path of a write current is the same as that of a read current.

SUMMARY

The inventive concepts relate to a magnetic memory device capable of performing high efficiency writing and a magnetic memory apparatus. Such a magnetic memory device and/or magnetic memory apparatus may have a structure of a 2-terminal structural spin orbit torque magnetoresistive random access memory (SOT-MRAM) as an MTJ structure so as to provide high efficiency writing method.

According to some example embodiments of the inventive concepts, a magnetic memory device may include a first fixed layer maintaining a particular (or, alternatively, predetermined) magnetization direction, a first non-magnetic layer, a free layer having perpendicular magnetic anisotropy and a variable magnetization direction, a second non-magnetic layer, and a second fixed layer maintaining a separate particular magnetization direction that is opposite to the particular (or, alternatively, predetermined) magnetization direction of the first fixed layer. A resistance value of a first magnetic tunnel junction (MTJ) element that includes the first fixed layer, the first non-magnetic layer, and the free layer may be different from a resistance value of a second MTJ element that includes the second fixed layer, the second non-magnetic layer, and the free layer.

According to some example embodiments of the inventive concepts, there a magnetic memory device may include a first MTJ element and a second MTJ element overlapping with each other in a vertical direction. The first MTJ element may include a first fixed layer having a first magnetization direction, a first non-magnetic layer, and a free layer having perpendicular magnetic anisotropy and a variable magnetization direction. The second MTJ element may include the free layer, a second non-magnetic layer, and a second fixed layer having a second magnetization direction that is opposite to the first magnetization direction. A resistance value of the first MTJ element may be different from a resistance value of the second MTJ element.

According to some example embodiments of the inventive concepts, there a magnetic memory apparatus may include a magnetic memory device and a circuit connected to the magnetic memory device and configured to apply a current to the magnetic memory device. The magnetic memory device may include a first fixed layer maintaining a particular (or, alternatively, predetermined) magnetization direction, a first non-magnetic layer, a free layer having perpendicular magnetic anisotropy and a variable magnetization direction, a second non-magnetic layer, and a second fixed layer maintaining a separate particular magnetization direction that is opposite to the particular (or, alternatively, predetermined) magnetization direction of the first fixed layer. The circuit may be configured to apply a write current through the first fixed layer and the second fixed layer to cause a domain wall to be formed in the free layer so that the free layer is divided into a first magnetization region and a second magnetization region having different magnetization directions by the domain wall, and the domain wall moves in relation to the first fixed layer and the second fixed layer (e.g., toward the first fixed layer and away from the second fixed layer, toward the second fixed layer and away from the first fixed layer, etc.).

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
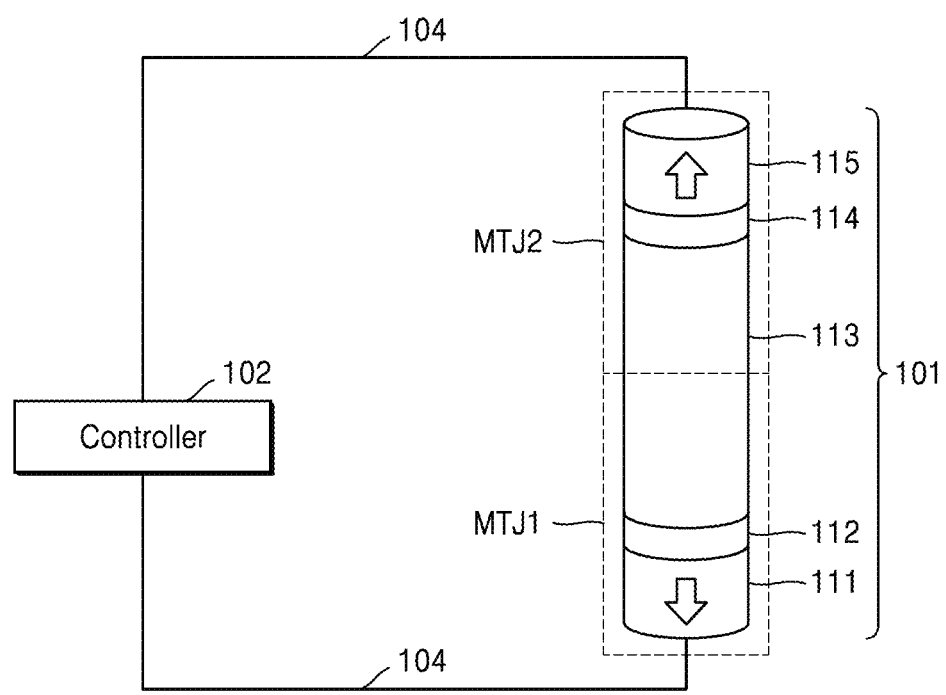
FIG. 1 is a schematic diagram of a magnetic memory apparatus according to some example embodiments.

Hereinafter, some example embodiments of the inventive concepts will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic diagram of a magnetic memory apparatus 100 according to some example embodiments. In FIG. 1, a structure of a magnetic memory device is illustrated by a perspective view and a circuit connected to the magnetic memory device is schematically illustrated by a block diagram.

Referring to FIG. 1, the magnetic memory apparatus 100 includes a magnetic memory device 101 and a controller 102. The magnetic memory device 101 includes a first fixed layer 111, a first non-magnetic layer 112, a free layer 113, a second non-magnetic layer 114, and a second fixed layer 115. As illustrated in FIG. 1, the first fixed layer 111, the first non-magnetic layer 112, the free layer 113, the second non-magnetic layer 114, and the second fixed layer 115 are sequentially stacked (e.g., stacked in the Z-direction, also referred to as a vertical direction, as shown in FIG. 1). As shown in FIGS. 1-11, the magnetic memory apparatus 100 may include a circuit (e.g., including controller 102 and conductive leads 104 (e.g., wires, conductive layers, contacts, vias, etc. which may comprise a conductive material, for example copper)) connected to the first fixed layer 111 and the second fixed layer 115 and configured to apply a current to the magnetic memory device 101, for example apply a current to move a domain wall (e.g., DW) of the free layer 113 (e.g., based on operation of at least the controller 102). The circuit may include the magnetic memory device 101.

The first fixed layer 111 and the second fixed layer 115 maintain (e.g., are configured to maintain) magnetization directions in particular (or, alternatively, predetermined) directions. For example, the first fixed layer 111 may maintain (e.g., may be configured to maintain) a particular magnetization direction (e.g., the first fixed layer 111 may have a first magnetization direction), and the second fixed layer 115 may maintain (e.g., may be configured to maintain) a separate particular magnetization that is opposite to the particular magnetization direction of the first fixed layer 111 (e.g., the second fixed layer 115 may have a second magnetization direction that is opposite to the first magnetization direction). The first fixed layer 111 and the second fixed layer 115 may include a material in which the magnetization directions do not easily change with respect to the free layer 113. That is, the first fixed layer 111 and the second fixed layer 115 may include a material with large effective magnetic anisotropy $Ku^{eff}$ and saturation magnetization Ms or a large self-relaxation constant α. However, the material of the first fixed layer 111 and the second fixed layer 115 is not limited thereto and an arbitrary material may be selected under various conditions.

For example, the first fixed layer 111 and the second fixed layer 115 may include a layer using cobalt-iron-boron (CoFeB) as a main component and a Co/platinum (Pt) multilayer. In addition, the first fixed layer 111 and the second fixed layer 115 may include a layer using a Heusler alloy layer as a main component and the Co/Pt multilayer. The layer using a Heusler alloy layer as the main component uses a Co-based full-Heusler alloy as a main component. Specifically, the Co-based full-Heusler alloy may include $Co_2FeSi$, $Co_2MnSi$, $Co_2FeMnSi$, $Co_2FeAl$, or $Co_2CrAl$. In addition, the Co/Pt multilayer is included so that the first fixed layer 111 and the second fixed layer 115 have large perpendicular magnetic anisotropy. The layer using a Heusler alloy layer as the main component contacts the first non-magnetic layer 112 or the second non-magnetic layer 114 on a first surface of the fixed layer 111 or 115. In addition, the layer using a Heusler alloy layer as the main component contacts the Co/Pt multilayer on a second surface that is opposite to the first surface thereof. The first fixed layer 111 and the second fixed layer 115 may maintain the magnetization directions in the particular (or, alternatively, predetermined) directions in a single layer by making the first fixed layer 111 and the second fixed layer 115 have the above-described several configurations. In addition, instead of the Co/Pt multilayer, by using an L10 type FePd, FePt, and MnGa alloy, a D022 type MnGa, and MnGe alloy, a Co/Pd multilayer, an L11 type CoPd alloy, or a CoPt alloy, a ferromagnetic body in which a magnetic easy axis is perpendicular to a surface thereof may be provided.

In addition, the first fixed layer 111 and the second fixed layer 115 are referred to as reference layers. The magnetization directions of the first fixed layer 111 and the second fixed layer 115 are opposite to each other.

The first non-magnetic layer 112 and the second non-magnetic layer 114 use an insulating material as a main component. The first non-magnetic layer 112 is provided between the first fixed layer 111 and the free layer 113 which are ferromagnetic materials. In addition, the second non-magnetic layer 114 is provided between the second fixed layer 115 and the free layer 113 which are ferromagnetic materials. For example, the first non-magnetic layer 112 and the second non-magnetic layer 114 may include an insulating layer such as magnesium oxide (MgO).

In addition, a material of the first non-magnetic layer 112 and the second non-magnetic layer 114 may be oxide having a sodium chloride (NaCl) structure such as calcium oxide (CaO), strontium oxide (SrO), titanium oxide (TiO), vanadium oxide (VO), or niobium oxide (NbO) other than MgO and is not limited unless functions of the first non-magnetic layer 112 and the second non-magnetic layer 114 deteriorate. For example, the first non-magnetic layer 112 and the second non-magnetic layer 114 may include spinel type $MgAl_2O_4$. In addition, for example, the first non-magnetic layer 112 and the second non-magnetic layer 114 may include a metal such as copper (Cu), chromium (Cr), or ruthenium (Ru).

A voltage may be perpendicularly applied to surfaces of the first non-magnetic layer 112 that contact the first fixed layer 111 and the free layer 113 so that a current flows to a magnetic tunnel junction (MTJ) element (the first fixed layer 111, the first non-magnetic layer 112, and the free layer 113) by the tunnel effect. As described above, a voltage is perpendicularly applied to surfaces of the second non-magnetic layer 114 that contacts the second fixed layer 115 and the free layer 113 so that a current flows to an MTJ element (the free layer 113, the second non-magnetic layer 114, and the second fixed layer 115) by the tunnel effect.

The free layer 113 has a magnetic easy axis in a direction perpendicular to a surface thereof (e.g., in the Z-direction) and a magnetization direction thereof varies in accordance with magnetization rotation and domain wall movement. The free layer 113 is magnetized to be perpendicular to the surface thereof and magnetization faces upward or downward (e.g., in the Z-direction). The free layer 113 may have perpendicular magnetic anisotropy and a variable magnetization direction. The free layer 113 may be magnetized in two or more opposite directions and may have a height (e.g., in the Z-direction) that is capable of forming a domain wall (e.g., the free layer 113 may have a height in the Z-direction, which may be parallel to a longitudinal axis of the free layer 113 and/or may intersect layers 111-115, that is sufficiently large in magnitude to configure the free layer 113 to form a domain wall DW as described herein). A material of the free layer 113 is not limited, and an arbitrary material may be selected under various conditions. For example, CoFeB may be used as a main component of the free layer 113. In addition, the free layer 113 may include a Co-based full-Heusler alloy. Specifically, the Co-based full-Heusler alloy may include $Co_2FeSi$, $Co_2MnSi$, $Co_2(Fe$—$Mn)$ Si, $Co_2FeAl$, or $Co_2CrAl$. In addition, a low saturation magnetization (low Ms) manganese-gallium-germanium (MnGaGe)-based material or an iron-nickel (FeNi)-based material with small inherent magnetocrystalline anisotropy energy Ku may be used.

The first fixed layer 111, the first non-magnetic layer 112, and the free layer 113 may at least partially comprise a first magnetic tunnel junction (MTJ) element MTJ1, and the second fixed layer 115, the second non-magnetic layer 114, and the free layer 113 may at least partially comprise a second MTJ element MTJ2. The first and second MTJ elements MTJ1 and MTJ2 may overlap with each other in a vertical direction (e.g., in the Z-direction), for example as shown in FIG. 1. The free layer 113 may be shared by the first and second MTJ elements MTJ1 and MTJ2 (e.g., the free layer of the first and second MTJ elements MTJ1 and MTJ2 may be the same free layer, for example as shown in FIG. 1). A resistance value (e.g., magnitude of electrical resistance) of a first MTJ element MTJ1 including the first fixed layer 111, the first non-magnetic layer 112, and the free layer 113 may be different from a resistance value of a second MTJ element MTJ2 including the second fixed layer 115, the second non-magnetic layer 114, and the free layer 113. In some example embodiments, at least one of an MTJ element MTJ1 or a second MTJ element MTJ2 may include a giant magnetoresistive (GMR) element.

Figure 10:
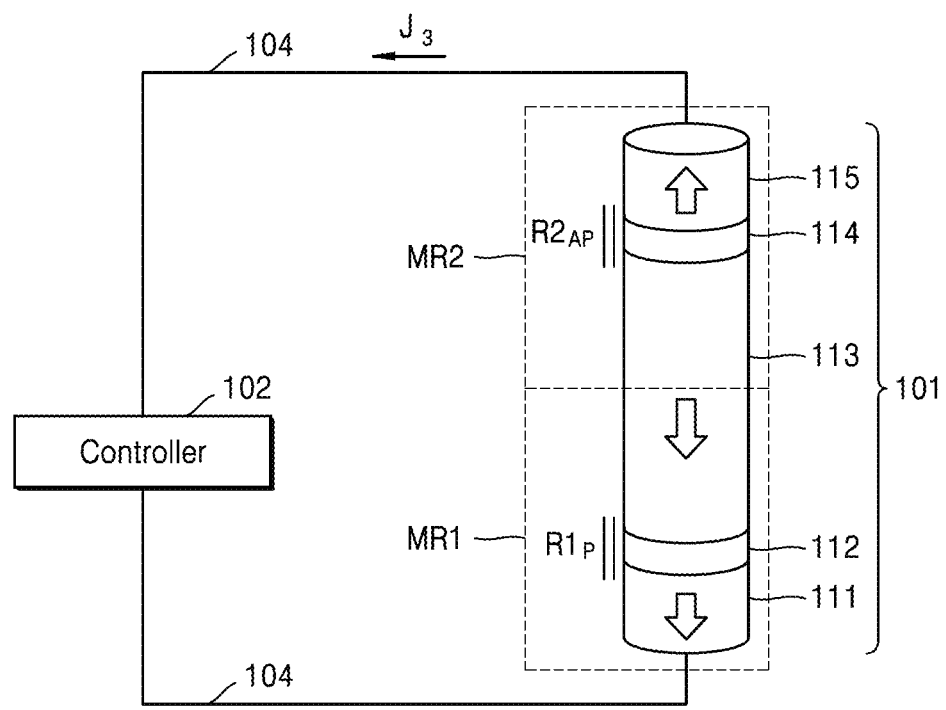
FIG. 10 illustrates a state of a magnetic memory apparatus in an operation of reading downward magnetization of a magnetic memory apparatus according to some example embodiments.
Figure 11:
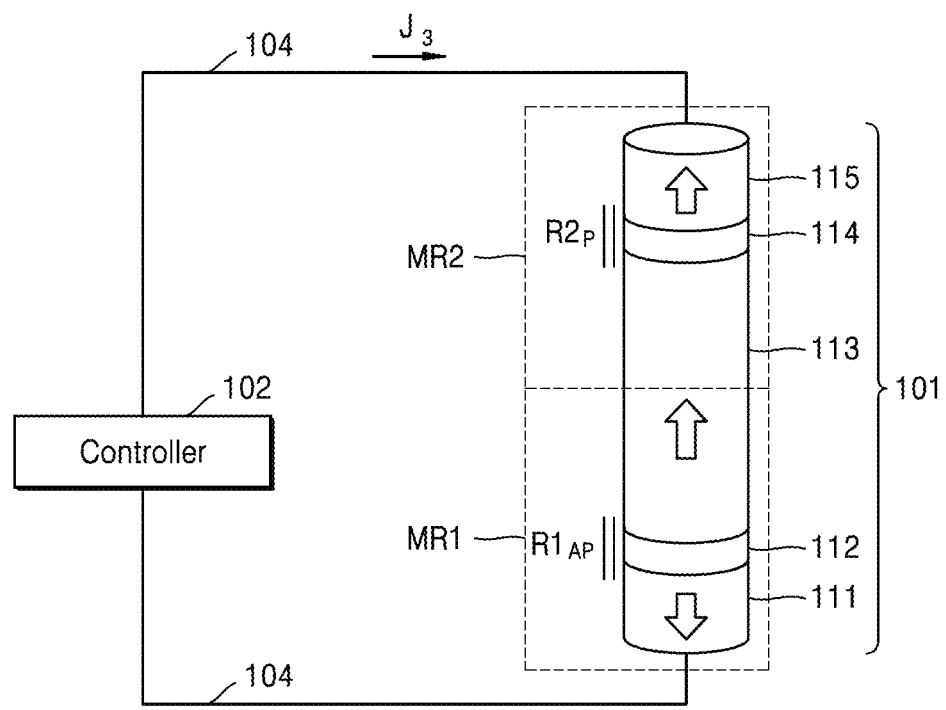
FIG. 11 illustrates a state of a magnetic memory apparatus in an operation of reading upward magnetization of a magnetic memory apparatus according to some example embodiments.

As shown in FIGS. 10-11, the first fixed layer 111, the first non-magnetic layer 112, and the free layer 113 may at least partially comprise a first magnetoresistive element MR1, and the second fixed layer 115, the second non-magnetic layer 114, and the free layer 113 may at least partially comprise a second magnetoresistive element MR2. The free layer 113 may be shared between the first and second magnetoresistive elements MR1 and MR2. In some example embodiments, a magnetic resistance (e.g., magnitude of magnetic resistance) of a first magnetoresistive element MR1 including the first fixed layer 111, the first non-magnetic layer 112, and the free layer 113 may be different from a magnetic resistance of a second magnetoresistive element MR2 including the second fixed layer 115, the second non-magnetic layer 114, and the free layer 113. In some example embodiments, at least one of a first magnetoresistive element MR1 including the first fixed layer 111, the first non-magnetic layer 112, and the free layer 113 or a second magnetoresistive element MR2 including the second fixed layer 115, the second non-magnetic layer 114, and the free layer 113 may include a giant magnetoresistive (GMR) element.

Referring back to FIG. 1, the controller 102 applies a voltage for generating spin for domain wall movement between the first fixed layer 111 and the second fixed layer 115 of the magnetic memory device 101. In addition, the controller 102 applies the voltage for the domain wall movement between the first fixed layer 111 and the second fixed layer 115 of the magnetic memory device 101. In addition, the controller 102 measures a current between the first fixed layer 111 and the second fixed layer 115 of the magnetic memory device 101 in order to read the magnetization direction (that is, written information) of the free layer 113.

By the above configuration, the magnetic memory apparatus 100 writes and reads data. Then, an operation of the controller 102 writing information in the magnetic memory device 101 and an operation of the controller 102 moving the domain wall in the free layer 113 (e.g., causing the domain wall to move in the free layer 113) are described.

FIGS. 2 to 9 are views illustrating an operation of the magnetic memory apparatus described with reference to FIG. 1 according to some example embodiments. FIGS. 2, 3, 4, and 5 illustrate a state of a magnetic memory apparatus in an operation of the magnetic memory apparatus writing upward magnetization according to some example embodiments. FIGS. 6, 7, 8, and 9 illustrate a state of a magnetic memory apparatus in an operation of the magnetic memory apparatus writing downward magnetization according to some example embodiments.

First, with reference to FIGS. 2 to 5, a method of writing upward magnetization in the free layer 113 according to some example embodiments is described. FIGS. 2 to 5 illustrate a state of a magnetic memory apparatus in an operation of the magnetic memory apparatus writing upward magnetization according to some example embodiments.

Figure 2:
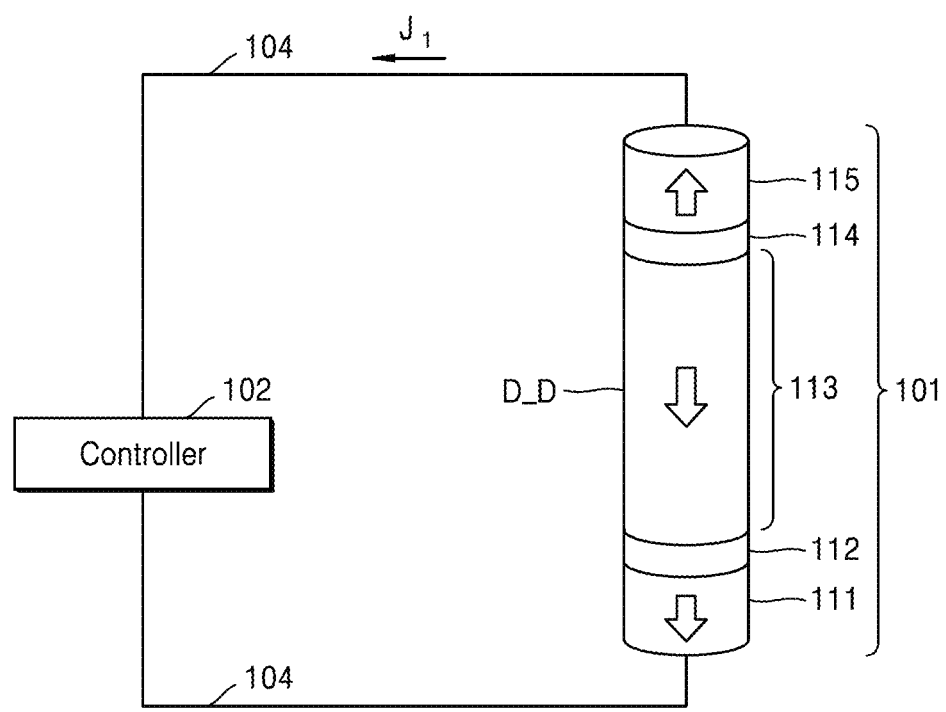
FIGS. 2, 3, 4, and 5 illustrate a state of a magnetic memory apparatus in an operation of the magnetic memory apparatus writing upward magnetization according to some example embodiments.

FIG. 2 illustrates the magnetic memory apparatus 100 before writing information according to some example embodiments. In FIG. 2, the free layer 113 that is a register is downward magnetized. Here, the free layer 113, which is downward magnetized, is referred to as a downward magnetization region D_D. In addition, the magnetization direction of the first fixed layer 111 is downward. The magnetization direction of the second fixed layer 115 is upward. In this state, when the upward magnetization is written in the free layer 113, the controller 102 makes a current $J_1$ flow from the first fixed layer 111 to the second fixed layer 115 (e.g., the controller 102 causes the current $J_1$ to be applied to the magnetic memory device 101 so as to flow from the first fixed layer 111 to the second fixed layer 115).

The free layer 113 may be magnetized in two or more opposite directions (e.g., in two opposite directions). As shown in at least FIGS. 3-4, the free layer 113 may have a height (e.g., in the Z-direction) capable of forming a domain wall DW (e.g., a height sufficiently large in magnitude to configure the free layer 113 to form a domain wall DW as described herein).

Figure 3:
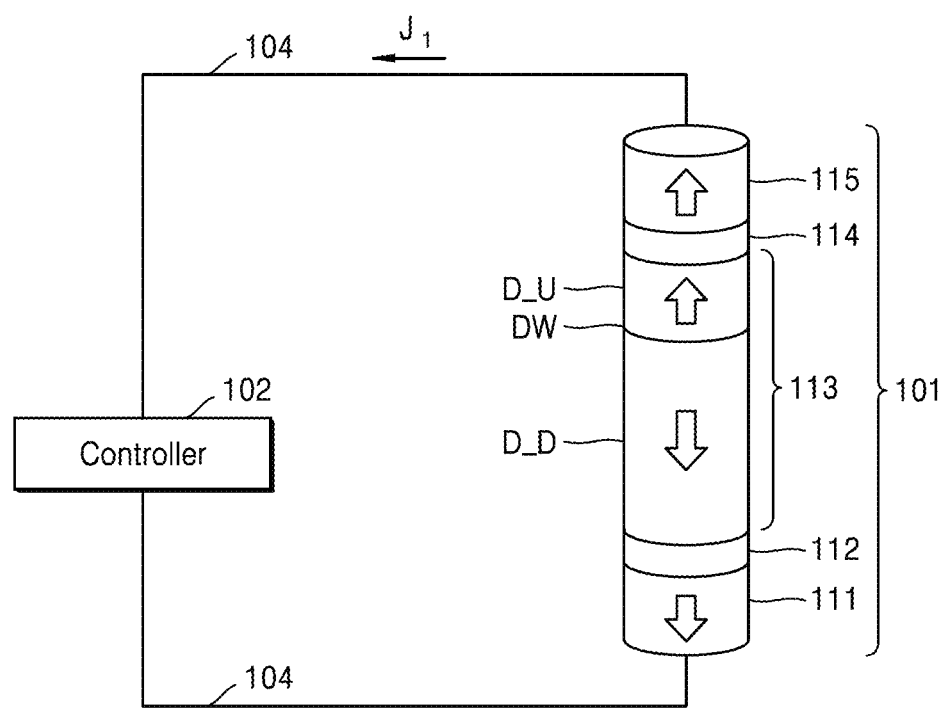
Figure 3:
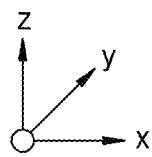

A state obtained after the current $J_1$ (e.g., write current) flows from FIG. 2 is illustrated in FIG. 3. In FIG. 3, the current $J_1$ flows to the magnetic memory device 101 so that upward spin is injected from the second fixed layer 115 to the free layer 113 and an upward magnetization region D_U is provided in a portion of the free layer 113 adjacent to second non-magnetic layer 114. In addition, the current $J_1$ flows to the magnetic memory device 101 so that a domain wall DW on a boundary between the upward magnetization region D_U and the downward magnetization region D_D moves (e.g., in the Z-direction) from the second non-magnetic layer 114 toward the first non-magnetic layer 112.

The downward magnetization region D_D may define a portion of the free layer 113 that is included in the first MTJ element MTJ1, and the upward magnetization region D_U may define a portion of the free layer 113 that is included in the second MTJ element MTJ2, such that the portion of the free layer 113 included in the first MTJ element MTJ1 is separated from a separate portion of the free layer 113 included in the second MTJ element MTJ2 by the domain wall DW. As shown in at least FIGS. 3-4, a portion of the free layer 113 included in the first MTJ element MTJ1 (e.g., the downward magnetization region D_D) may have a magnetization direction (e.g., downward magnetization direction in the Z-direction) that is opposite to a separate magnetization direction (e.g., upward magnetization direction in the Z-direction) of the portion of the free layer 113 included in the second MTJ element MTJ2 (e.g., the upward magnetization region D_U).

Figure 4:
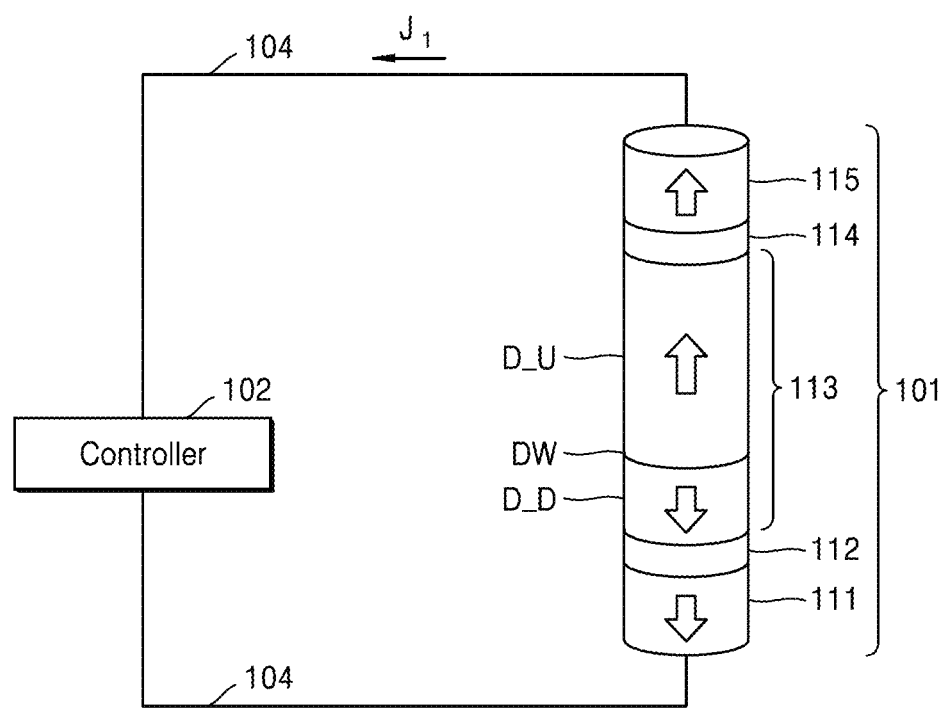

A state obtained after the current $J_1$ flows from FIG. 3 is illustrated in FIG. 4. In FIG. 4, the current $J_1$ flows to the magnetic memory device 101 so that the domain wall DW moves toward the first non-magnetic layer 112.

Figure 5:
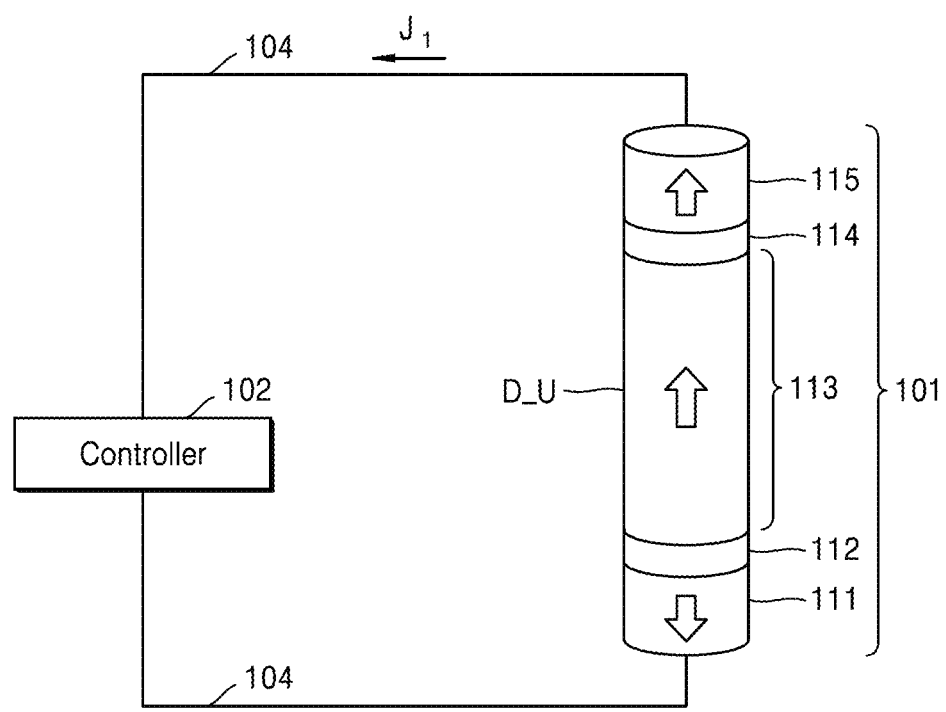

A state obtained after the current $J_1$ flows from FIG. 4 is illustrated in FIG. 5. In FIG. 5, the current $J_1$ flows to the magnetic memory device 101 so that the domain wall DW reaches the first non-magnetic layer 112 and an entirety of the free layer 113 is upward magnetized. That is, an entire region of the free layer 113 may be the upward magnetization region D_U.

Accordingly, and as shown in at least FIGS. 2-5, the circuit (e.g., controller 102) may be configured to apply a write current (e.g., current $J_1$) through the first fixed layer 111 and the second fixed layer 115 to cause a domain wall DW to be formed in the free layer 113 so that the free layer 113 is divided into a first magnetization region (e.g., downward magnetization region D_D) and a second magnetization region (e.g., upward magnetization region D_U) having different magnetization directions (e.g., downward and upward, respectively) by the domain wall DW, and where the domain wall DW moves in relation to the first fixed layer 111 and the second fixed layer 115 (e.g., away from the second fixed layer 115 and towards the first fixed layer 111).

By such a method, the upward magnetization may be written in the free layer 113.

Hereinafter, a method of writing downward magnetization in the free layer 113 according to some example embodiments will be described with reference to FIGS. 6 to 9. FIGS. 6 to 9 illustrate a state of a magnetic memory apparatus in an operation of the magnetic memory apparatus writing downward magnetization according to some example embodiments.

Figure 6:
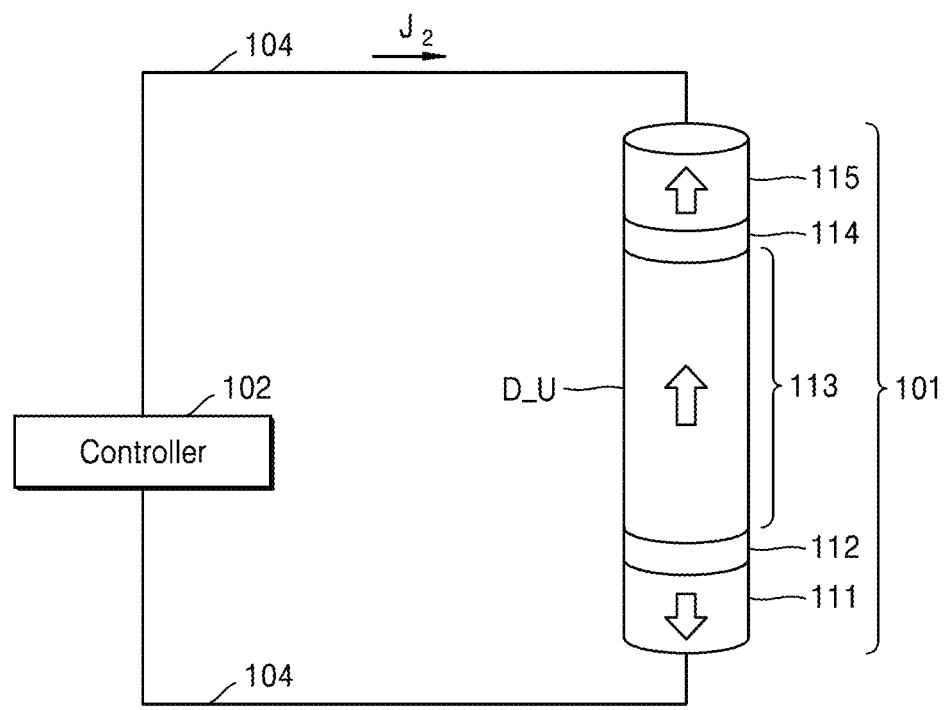
FIGS. 6, 7, 8, and 9 illustrate a state of a magnetic memory apparatus in an operation of the magnetic memory apparatus writing downward magnetization according to some example embodiments.

FIG. 6 illustrates the magnetic memory apparatus 100 before writing information. In FIG. 6, the free layer 113 is upward magnetized. That is, an entire region of the free layer 113 may be the upward magnetization region D_U. In addition, the magnetization direction of the first fixed layer 111 is downward. The magnetization direction of the second fixed layer 115 is upward. In this state, when the downward magnetization is written in the free layer 113, the controller 102 makes a current $J_2$ (e.g., write current) flow from the second fixed layer 115 to the first fixed layer 111 (e.g., the controller 102 causes the current $J_2$ to be applied to the magnetic memory device 101 so as to flow from the second fixed layer 115 to the first fixed layer 111).

Figure 7:
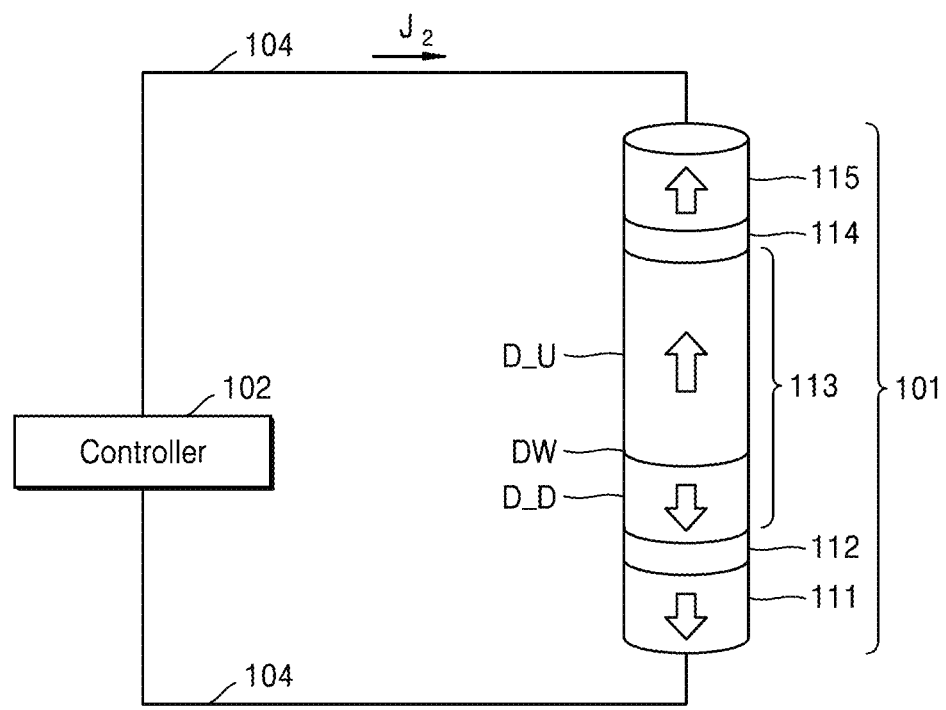

A state obtained after the current $J_2$ flows from FIG. 6 is illustrated in FIG. 7. In FIG. 7, the current $J_2$ flows to the magnetic memory device 101 so that downward spin is injected from the first fixed layer 111 to the free layer 113 and the downward magnetization region D_D is provided a portion of the free layer 113 adjacent to the first non-magnetic layer 112. In addition, the current $J_2$ flows to the magnetic memory device 101 so that the domain wall DW on the boundary between the upward magnetization region D_U and the downward magnetization region D_D moves from the first non-magnetic layer 112 toward the second non-magnetic layer 114.

Figure 8:
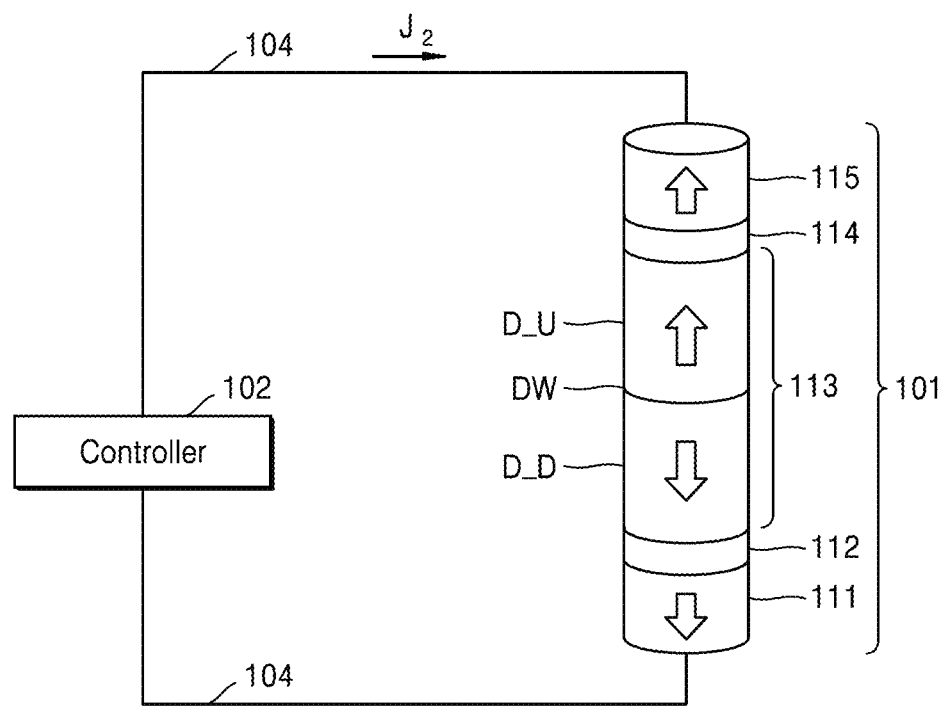

A state obtained after the current $J_2$ flows from FIG. 7 is illustrated in FIG. 8. In FIG. 8, the current $J_2$ flows to the magnetic memory device 101 so that the domain wall DW moves further to the second non-magnetic layer 114.

Figure 9:
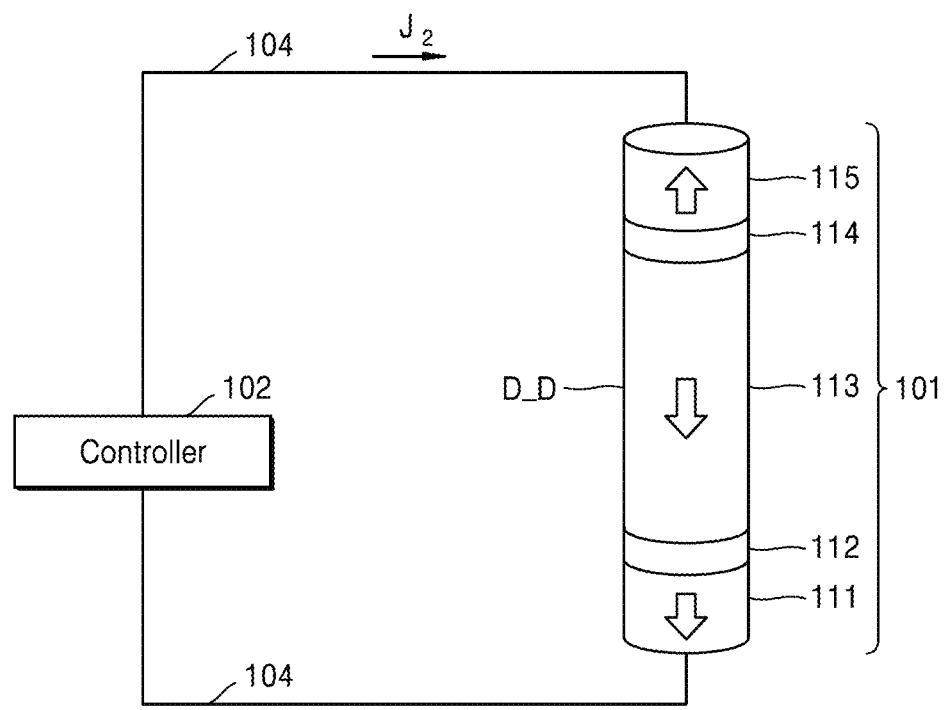

A state obtained after the current $J_2$ flows from FIG. 8 is illustrated in FIG. 9. In FIG. 9, the current $J_2$ flows to the magnetic memory device 101 so that the domain wall DW reaches the second non-magnetic layer 114 and an entirety of the free layer 113 is downward magnetized. That is, an entire region of the free layer 113 may be the downward magnetization region D_D. By such a method, the downward magnetization may be written in the free layer 113.

Accordingly, and as shown in at least FIGS. 6-9, the circuit (e.g., controller 102) may be configured to apply a write current (e.g., current $J_2$) through the first fixed layer 111 and the second fixed layer 115 to cause a domain wall DW to be formed in the free layer 113 so that the free layer 113 is divided into a first magnetization region (e.g., downward magnetization region D_D) and a second magnetization region (e.g., upward magnetization region D_U) having different magnetization directions (e.g., downward and upward, respectively) by the domain wall DW, and where the domain wall DW moves in relation to the first fixed layer 111 and the second fixed layer 115 (e.g., away from the first fixed layer 111 and towards the second fixed layer 115).

Then, an operation of the controller 102 reading information from the magnetic memory device 101 will be described. The controller 102 determines whether the magnetic memory device 101 is upward magnetized or downward magnetized by a magnitude of the current flowing to the magnetic memory device 101.

FIGS. 10 and 11 are views illustrating an operation of the magnetic memory apparatus described with reference to FIG. 1.

The controller 102 measures a value of a read current $J_3$. The value (e.g., magnitude) of the read current $J_3$ is less than values of the write currents $J_1$ and $J_2$. In addition, the read current $J_3$ may have any direction.

First, referring to FIG. 10, an example of reading the downward magnetization will be described. The free layer 113, the second non-magnetic layer 114, and the second fixed layer 115 form a tunneling magneto resistance (TMR) element. In FIG. 10, because the magnetization direction of the second fixed layer 115 is opposite to that of the free layer 113, antiparallel magnetoresistance $R2_{AP}$ is obtained. In addition, the first fixed layer 111, the first non-magnetic layer 112, and the free layer 113 form a TMR element. In FIG. 10, because the magnetization direction of the first fixed layer 111 is the same as that of the free layer 113, parallel magnetoresistance $R1_P$ is obtained. Here, a resistance value $R_{down}$ of the free layer 113 having the downward magnetization is almost equal to $R1_P+R2_{AP}$.

Referring to FIG. 11, an example of reading the upward magnetization will be described. In FIG. 11, because the magnetization direction of the second fixed layer 115 is the same as that of the free layer 113, parallel magnetoresistance $R2_P$ is obtained. In addition, in FIG. 11, because the magnetization direction of the first fixed layer 111 is opposite to that of the free layer 113, antiparallel magnetoresistance $R1_{AP}$ is obtained. Here, a resistance value $R_{UP}$ of the magnetic memory device 101 when the free layer 113 has the upward magnetization is almost equal to $R1_{AP}+R2_P$.

In the magnetic memory device 101, because the resistance value $R_{down}$, where the free layer 113 has the downward magnetization, is different from the resistance value $R_{UP}$, where the free layer 113 has the upward magnetization, the controller 102 may determine whether the magnetic memory device 101 is upward magnetized or downward magnetized by a magnitude of a current flowing when a fixed voltage is applied to the magnetic memory device 101.

Then, a configuration in which the resistance value $R_{down}$ of the free layer 113 having the downward magnetization is different from the resistance value $R_{UP}$ of the free layer 113 having the upward magnetization will be described.

Assuming that a magnetoresistance (MR) ratio of MR1 (e.g., a first magnetoresistive element including the first fixed layer 111, the first non-magnetic layer 112, and the free layer 113) is equal to that of MR2 (e.g., a second magnetoresistive element including the free layer 113, the second non-magnetic layer 114, and the second fixed layer 115), the following equation is established.

Here, $MR1 \equiv (R1_{AP}-R1_P)/R1_P, MR2 \equiv (R2_{AP}-R2_P)/R2_P$.

$\alpha R1_P = R1_{AP}$ $\alpha R2_P = R2_{AP}$

α: an amount corresponding to the MR ratio

In addition, it is assumed that $R2_P$ is β times of $R1_P$, that is, $\beta R1_P = R2_P$.

β: a ratio between resistance values of $R1_P$ and $R2_P$

It is established that $\alpha\beta R1_P = R2_{AP}$. A ratio between the resistance value $R_{UP}$ of the free layer 113 having the upward magnetization and the resistance value $R_{down}$ of the free layer 113 having the downward magnetization is as follows.

$R_{UP}/R_{down} = (\alpha+\beta)/(1+\alpha\beta)$

Here, when $\beta \neq 1, R_{UP}/R_{down} \neq 1$.

That is, when the resistance value of the parallel magnetoresistance $R1_P$ is different from that of parallel magnetoresistance $R2_P$, the resistance value $R_{UP}$ of the free layer 113 having the upward magnetization is different from the resistance value $R_{down}$ of the free layer 113 having the downward magnetization. As a result, the controller 102 may determine whether the magnetic memory device 101 is upward magnetized or downward magnetized by the magnitude of the current flowing to the magnetic memory device 101.

For example, when the MR1 including the first fixed layer 111, the first non-magnetic layer 112, and the free layer 113 is a giant magnetoresistive (GMR) element, the MR2 including the free layer 113, the second non-magnetic layer 114, and the second fixed layer 115 may be a TMR element. In this case, a resistance value and magnetic resistance of the MR2 are large.

Figure 12:
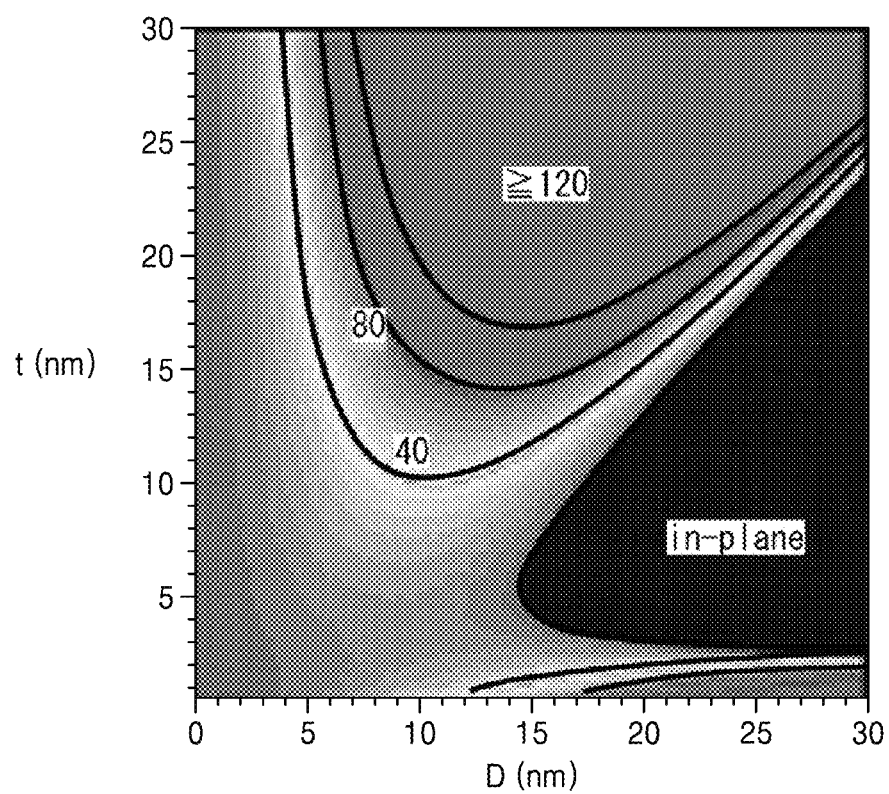
FIG. 12 is a graph illustrating a relationship between a structure and thermal stability of a magnetic tunnel junction (MTJ) element in a magnetic memory apparatus according to some example embodiments.

FIG. 12 is a graph illustrating a relationship between a structure and thermal stability of a magnetic tunnel junction (MTJ) element in a magnetic memory apparatus according to some example embodiments. In FIG. 12, the vertical axis represents a thickness t of the free layer 113 and the horizontal axis represents a diameter D of the MTJ element.

In FIG. 12, a combination of the thickness ("t (nm)") and diameter ("D (nm)") of the free layer 113, in which a thermal stability factor Δ is large, is suitable for a spin orbit torque (SOT) writing method. That is, in FIG. 12, a combination of the thickness and diameter of the free layer 113, in which the thermal stability factor Δ is greater than or equal to 40, is suitable for the SOT writing method. In particular, a combination of the thickness and diameter of the free layer 113, in which the thermal stability factor Δ is greater than or equal to 80, is suitable for the SOT writing method. A combination of the thickness and diameter of the free layer 113, in which the thermal stability factor Δ is greater than or equal to 120, is most suitable for the SOT writing method.

Specifically, a ratio obtained by dividing a height of the free layer 113 (e.g., height in the Z-direction and or height in parallel with a longitudinal axis of the magnetic memory device 101) by the diameter of the free layer 113 (e.g., diameter in the X and/or Y-directions and/or diameter in a direction perpendicular to the longitudinal axis of the magnetic memory device 101) may be greater than or equal to about 1. Restated, a ratio of a magnitude of the height of the free layer to a magnitude of a diameter of the free layer may be greater than or equal to about 1. In addition, the height of the free layer 113 (e.g., height in the Z-direction and or height in parallel with a longitudinal axis of the magnetic memory device 101) may be greater than or equal to about 20 nm and may be equal to or less than about 10,000 nm, 1000 nm, 500 nm, 200 nm, 100 nm, 50 nm, 25 nm, or the like (e.g., between about 20 nm and about 100 nm). In addition, the diameter of the free layer 113 (e.g., diameter in the X and/or Y-directions and/or diameter in a direction perpendicular to the longitudinal axis of the magnetic memory device 101) may be smaller than or equal to about 10 nm and may be greater than or equal to about 0.1 nm, 0.5 nm, 1 nm, 2 nm, 5 nm, or the like (e.g., between about 1 nm and about 10 nm). In some example embodiments, a ratio obtained by dividing the height of the free layer 113 by the diameter of the free layer 113 is greater than or equal to about 2. However, the height and diameter of the free layer 113 are not limited thereto.

As described above, in the magnetic memory apparatus according to the some example embodiments, by using the domain wall movement, by a 2-terminal structural element, an MTJ element device with high reliability, for example, without deterioration of thermal stability even in a wide temperature range of −40° C. to +150° C. may be provided. Furthermore, a magnetic random-access memory (MRAM) product and a dynamic RAM (DRAM) alternative product may be provided. In the magnetic memory apparatus according to the some example embodiments, by making the material of the free layer have low Ms (low saturation magnetization), a high high-speed writing (several nanoseconds (ns)) and low consumption current may be obtained. In addition, in the magnetic memory apparatus according to the some example embodiments, by forming the free layer to be vertically long, by using shape magnetic anisotropy, thermal stability that may not be secured by a conventional art may be secured and the MTJ element may be highly integrated so that a size of the MTJ element may be no more than 10 nm. In particular, the MTJ element device without the deterioration of the thermal stability even in the wide temperature range of −40° C. to +150° C. may be implemented.

In addition, the inventive concepts are not limited thereto and proper changes may be made without deviating from the scope and spirit of the inventive concepts. For example, in some example embodiments, it is described that the first fixed layer 111, the first non-magnetic layer 112, and the free layer 113 form the TMR element. However, as the first non-magnetic layer 112, instead of an insulating layer, a non-magnetic metal layer may be stacked so that the first fixed layer 111, the first non-magnetic layer 112, and the free layer 113 may form the GMR element. The free layer 113, the second non-magnetic layer 114, and the second fixed layer 115 may form the GMR element.

In addition, in the above-described element, in FIG. 1, it is illustrated that the first fixed layer 111, the first non-magnetic layer 112, the free layer 113, the second non-magnetic layer 114, and the second fixed layer 115 are cylindrical. However, the first fixed layer 111, the first non-magnetic layer 112, the free layer 113, the second non-magnetic layer 114, and the second fixed layer 115 may have any shape if the first fixed layer 111, the first non-magnetic layer 112, the free layer 113, the second non-magnetic layer 114, and the second fixed layer 115 may be stacked. For example, the first fixed layer 111, the first non-magnetic layer 112, the free layer 113, the second non-magnetic layer 114, and the second fixed layer 115 may be square pillar.

As described herein, any apparatuses, devices, circuits, controllers, and/or portions thereof according to any of the example embodiments, and/or any portions thereof (including, without limitation, the controller 102, circuit, magnetic memory device 101, and/or magnetic memory apparatus 100 as described herein, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the image sensor, including the functionality and/or methods performed by some or all of any devices, controllers, and/or portions thereof according to any of the example embodiments, and/or any portions thereof (e.g., the functionality of the controller 102, circuit, magnetic memory device 101, and/or magnetic memory apparatus 100 as described herein, or the like).

Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

The controller 102 may include a power supply and/or a connection to a power supply, and the controller 102 may be configured to control a current applied to a circuit that is connected to the magnetic memory device 101 based on controlling a supply of electrical power from the power supply and/or connection to the power supply, for example based on executing a program of instructions stored in a memory of the controller 102.

A magnetic memory device according to some example embodiments may be obtained by sequentially stacking a first fixed layer maintaining a particular (or, alternatively, predetermined) magnetization direction, a first non-magnetic layer, a free layer having a variable magnetization direction, a second non-magnetic layer, and a second fixed layer maintaining a magnetization direction opposite to that of the first fixed layer. A resistance value of an MTJ element including the first fixed layer, the first non-magnetic layer, and the free layer (also referred to herein as a first MTJ element) may be different from a resistance value of an MTJ element including the second fixed layer, the second non-magnetic layer, and the free layer (also referred to herein as a second MTJ element).

A magnetic memory device according to some example embodiments may have a simple structure and high reliability and may be driven by low power at a high speed.

In a magnetic memory device according to some example embodiments, the free layer may be magnetized in two or more opposite directions and may have a height capable of forming a domain wall (e.g., a height in the Z-direction that is sufficiently large in magnitude to configure the free layer to form a domain wall as described herein).

In a magnetic memory device according to some example embodiments, the magnetization state of the free layer may correspond to "0" and "1" of recorded information. In particular, as a ratio between "the height of the free layer and the diameter of the free layer" increases, the shape magnetic anisotropy of the free layer may increase and thermal stability of the device may be improved. In addition, by forming one or more domain walls in the free layer, magnetization of the vertically longitudinal free layer, which may not be recorded in conventional spin transfer torque magnetoresistive random access memory (STT-MRAM) or SOT-MRAM, may be efficiently rewritten. That is, by making a current flow to interfaces of the respective layers of the magnetic memory device in a vertical direction, the magnetization direction of the free layer may be aligned in a specific direction by magnetization reversal of the interface of the free layer, which is caused by spin injection from the fixed layer, and the domain wall movement caused by spin flow. By making a current flow in an opposite direction, the magnetization direction of the free layer may be aligned in a direction opposite to the above magnetization direction.

In a magnetic memory device according to some example embodiments, magnetic resistance of a magnetoresistive element including the first fixed layer, the first non-magnetic layer, and the free layer may be different from that of a magnetoresistive element including the second fixed layer, the second non-magnetic layer, and the free layer.

In a magnetic memory device according to some example embodiments, due to two magnetoresistive elements, in the magnetization direction of the free layer, the resistance (value) of the magnetic memory device (between the first fixed layer and the second fixed layer) changes. As the change in resistance value increases, the magnetization direction ("0" and "1" of written information) of the free layer may be easily read.

In a magnetic memory device according to some example embodiments, at least one of the magnetoresistive element including the first fixed layer, the first non-magnetic layer, and the free layer or the magnetoresistive element including the second fixed layer, the second non-magnetic layer, and the free layer may be a GMR element.

In a magnetic memory device according to some example embodiments, because the resistance of the GMR element is smaller than that of the MTJ element, the resistance between the first fixed layer and the second fixed layer may be reduced. That is, an amount of operating power of the magnetic memory device may be reduced. In addition, because the magnetic resistance of the MTJ element predominantly affects the change in resistance value of the magnetic memory device when only one of the two magnetoresistive elements is the GMR element, in the magnetization direction of the free layer, the change in resistance value between the first fixed layer and the second fixed layer may increase.

In a magnetic memory device according to some example embodiments, the ratio obtained by dividing the height of the free layer by the diameter of the free layer may be greater than or equal to 1.

In a magnetic memory device according to some example embodiments, the height of the free layer may be smaller than or equal to 20 nm.

In a magnetic memory device according to some example embodiments, the diameter of the free layer may be greater than or equal to 10 nm.

In a magnetic memory device according to some example embodiments, even in the wide temperature range of −40° C. to +150° C., the deterioration of the thermal stability may be prevented or reduced.

A magnetic memory apparatus according to some example embodiments may include one of the above-described magnetic memory devices and a circuit contacting the first fixed layer and the second fixed layer and making a current flow to the domain wall of the free layer.

In a magnetic memory apparatus according to some example embodiments, a magnetic memory device may have a simple structure and high reliability and may be driven by low power at a high speed.

While the inventive concepts have been particularly shown and described with reference to some example embodiments thereof, it will be understood that various changes in form and details may be made therein without departing from the spirit and scope of the following claims.

What is claimed is:

1. A device, comprising:
    a first fixed layer maintaining a particular magnetization direction;
    a first non-magnetic layer;
    a free layer including a first portion and a second portion and having perpendicular magnetic anisotropy and a variable magnetization direction;
    a second non-magnetic layer; and
    a second fixed layer maintaining a separate particular magnetization direction that is opposite to the particular magnetization direction of the first fixed layer,
    wherein a resistance value of a first magnetic tunnel junction (MTJ) element that includes the first fixed layer, the first non-magnetic layer, and the first portion of the free layer is different from a resistance value of a second MTJ element that includes the second fixed layer, the second non-magnetic layer, and the second portion of the free layer wherein
    the free layer is a single continuous layer, and
    the first portion of the free layer included in the first MTJ element is separated from the second portion of the free layer included in the second MTJ element by a domain wall.

2. The device of claim 1, wherein the free layer is magnetized in two or more opposite directions and has a height capable of forming the domain wall.

3. The device of claim 1, wherein at least one of a first magnetoresistive element including the first fixed layer, the first non-magnetic layer, and the free layer and or a second magnetoresistive element including the second fixed layer, the second non-magnetic layer, and the free layer includes a giant magnetoresistive (GMR) element.

4. The device of claim 1, wherein a ratio obtained by dividing a height of the free layer by a diameter of the free layer is greater than or equal to about 1.

5. The device of claim 1, wherein a height of the free layer is greater than or equal to about 20 nm.

6. The device of claim 1, wherein a diameter of the free layer is smaller than or equal to about 10 nm.

7. The device of claim 1, further comprising:
a circuit connected to the first fixed layer and the second fixed layer, the circuit configured to apply a current to move the domain wall of the free layer.

8. A magnetic memory device, comprising:
a first magnetic tunnel junction (MTJ) element and a second MTJ element overlapping with each other in a vertical direction,
wherein the first MTJ element includes
a first fixed layer having a first magnetization direction,
a first non-magnetic layer, and
a first portion of a free layer having perpendicular magnetic anisotropy and a variable magnetization direction,
wherein the second MTJ element includes
a second portion of the free layer,
a second non-magnetic layer, and
a second fixed layer having a second magnetization direction that is opposite to the first magnetization direction,
wherein a resistance value of the first MTJ element is different from a resistance value of the second MTJ element, wherein
the free layer is a single continuous layer, and
the first portion of the free layer included in the first MTJ element is separated from the second portion of the free layer included in the second MTJ element by a domain wall.

9. The magnetic memory device of claim 8, wherein the free layer has a height of greater than or equal to about 20 nm and a diameter of smaller than or equal to about 10 nm.

10. The magnetic memory device of claim 8, wherein the free layer has a height capable of forming the domain wall.

11. The magnetic memory device of claim 10, wherein a portion of the free layer included in the first MTJ element is separated from a separate portion of the free layer included in the second MTJ element by the domain wall.

12. The magnetic memory device of claim 11, wherein the portion of the free layer included in the first MTJ element has a magnetization direction that is opposite to a separate magnetization direction of the portion of the free layer included in the second MTJ element.

13. The magnetic memory device of claim 8, wherein at least one of the first MTJ element or the second MTJ element includes a giant magnetoresistive (GMR) element.

14. A magnetic memory apparatus, comprising:
a magnetic memory device; and
a circuit connected to the magnetic memory device and configured to apply a current to the magnetic memory device,
wherein the magnetic memory device includes
a first fixed layer maintaining a particular magnetization direction;
a first non-magnetic layer,
a free layer including a first portion and a second portion and having perpendicular magnetic anisotropy and a variable magnetization direction,
a second non-magnetic layer, and
a second fixed layer maintaining a separate particular magnetization direction that is opposite to the particular magnetization direction of the first fixed layer, wherein
the free layer is a single continuous layer,
the circuit is configured to apply a write current through the first fixed layer and the second fixed layer to cause a domain wall to be formed in the free layer so that
the free layer is divided into a first magnetization region including the first portion of the free layer and a second magnetization region including the second portion of the free layer having different magnetization directions by the domain wall, and
the domain wall moves in relation to the first fixed layer and the second fixed layer.

15. The magnetic memory apparatus of claim 14, wherein a resistance value of a first magnetic tunnel junction (MTJ) element including the first fixed layer, the first non-magnetic layer, and the first portion of the free layer is different from a resistance value of a second MTJ element including the second fixed layer, the second non-magnetic layer, and the second portion of the free layer.

16. The magnetic memory apparatus of claim 15, wherein at least one of the first MTJ element or the second MTJ element includes a giant magnetoresistive (GMR) element.

17. The magnetic memory apparatus of claim 14, wherein the free layer has a height of greater than or equal to about 20 nm and a diameter of smaller than or equal to about 10 nm.

18. The magnetic memory apparatus of claim 14, wherein a ratio obtained by dividing a height of the free layer by a diameter of the free layer is greater than or equal to about 1.

* * * * *